United States Patent [15] 3,637,380
Hallman et al. [45] Jan. 25, 1972

[54] METHODS FOR ELECTROCHEMICALLY MAKING METALLIC PATTERNS BY MEANS OF RADIATION-SENSITIVE ELEMENTS

[72] Inventors: Robert W. Hallman, Utica; Gary W. Kurtz, Southfield, both of Mich.

[73] Assignee: Teeg Research, Inc., Detroit, Mich.

[22] Filed: Aug. 8, 1969

[21] Appl. No.: 848,676

Related U.S. Application Data

[63] Continuation-in-part of Ser. No. 648,713, June 26, 1967, abandoned.

[52] U.S. Cl. ........ 96/35, 96/27, 96/36, 96/36.2, 96/36.3, 204/15, 204/18, 204/43, 204/45, 204/143, 250/65, 250/65.1
[51] Int. Cl. ........ G03c 5/00, C23b 5/48
[58] Field of Search ........ 96/1.5, 27, 36, 36.2, 36.3, 96/86, 88, 35; 252/501; 117/93.3, 217; 204/15, 43, 157.1; 156/3, 4, 17, 18; 29/195; 250/65, 65.1

[56] References Cited

UNITED STATES PATENTS

| | | | |
|---|---|---|---|
| 3,122,463 | 2/1964 | Ligenza et al. | 156/4 |
| 3,271,180 | 9/1966 | White | 96/36 X |
| 3,346,384 | 10/1967 | Gaynor | 96/36 |
| 3,377,169 | 4/1968 | Blake | 96/88 |
| 3,386,823 | 6/1968 | Keller et al. | 96/27 |
| 3,440,046 | 4/1969 | Droege et al. | 96/27 |

OTHER PUBLICATIONS

Kostyshin et al., " Photographic–Sensitivity Effect in Thin Semiconducting Films on Metal Substrates," Soviet Physics–Solid State, Vol. 8, No. 2, Feb. 1966, pp. 451–452.

*Primary Examiner*—George F. Lesmes
*Assistant Examiner*—R. E. Martin
*Attorney*—Hauke, Gifford and Patalidis

[57] ABSTRACT

Methods for making metallic patterns by projecting an image of a pattern to be reproduced on an electromagnetic radiation-sensitive element consisting essentially of a first layer coated with an adhering overlayer of an inorganic material capable of reacting, when exposed to electromagnetic actinic radiation, with the first layer. After exposure, the portions of the overlayer having a reduced adhesion with the first layer as a result of such exposure are peeled, thus selectively and discretely exposing surface areas of the first layer which are subsequently electroplated or electrochemically eroded or etched according to whether a relief or a recessed pattern is desired.

Radiation-sensitive elements having a first layer thin enough to be transmissive of the radiation may be exposed by projection of the image of the pattern upon the first layer, thus consuming in depth selective and discrete portions of the first layer. The remaining unreacted portions of the first layer are subsequently electroplated.

10 Claims, 22 Drawing Figures

INVENTORS
ROBERT W. HALLMAN
GARY W. KURTZ

BY Hauke, Gifford & Patalidis
ATTORNEYS

INVENTORS
ROBERT W. HALLMAN
GARY W. KURTZ
BY Hauke, Gifford & Patalidis
ATTORNEYS

METHODS FOR ELECTROCHEMICALLY MAKING METALLIC PATTERNS BY MEANS OF RADIATION-SENSITIVE ELEMENTS

CROSS-REFERENCE TO RELATED APPLICATIONS

This application is a continuation-in-part of application, Ser. No. 648,713, filed June 26, 1967, now abandoned, and is copending with applications Ser. Nos. 839,038, 841,416 and 841,718, filed respectively July 3, 1969, July 14, 1969, and July 15, 1969.

BACKGROUND OF THE INVENTION

In the copending application, Ser. No. 839,038 and in the other copending applications, there are disclosed electromagnetic radiation-sensitive elements typically consisting of a metallic layer, as defined therein and herein, provided with an adhering overlayer of an inorganic material capable of interacting with the metallic layer when exposed to incident actinic radiation, such as light radiation and the like. The radiation induced interreaction between the metallic layer and the overlayer extends in depth from the interface between the metallic layer and the overlayer proportionally to the exposure to actinic radiation of the sensitive element. There is formed at the interface between the metallic layer and the overlayer, as a result of such radiation induced interreaction, product or products having chemical compositions and physical characteristics different from the constituents of both the metallic layer and the overlayer. As particularly disclosed in copending application, Ser. No. 841,718, the formation of such interreaction product at the boundary between the two layers corresponding to the areas selectively and discretely exposed to impinging electromagnetic actinic radiation causes a decrease in the force of adhesion between the two layers, such that the overlayer may be selectively and discretely removed, as by peeling, from the portions of the surface of the metallic layer corresponding to such selectively and discretely exposed areas.

SUMMARY OF THE INVENTION

The present invention has for its principal object to provide methods for electrochemically treating the portions of the surface of the metallic layer thus bared or uncovered such as to plate thereon a similar or different metal, according to one aspect of the invention, or so as to electrochemically erode to a predetermined depth or entirely, such bared or uncovered portions of the metallic layer, according to another aspect of the invention.

According to a further aspect of the present invention, exposure of the radiation-sensitive element is effected on the metallic layer side of elements having a metallic layer thin enough to transmit the actinic radiation, thus consuming portions of the metallic layer, the remaining portions whereof are subsequently electroplated.

The many objects and advantages of the present invention will become apparent to those skilled in the art when the following description of a few examples of the best modes contemplated for practicing the invention is considered in conjunction with the accompanying drawings, wherein like reference numerals refer to like or equivalent parts, and in which:

DESCRIPTION OF THE PREFERRED EMBODIMENTS

Figures 1, 2:
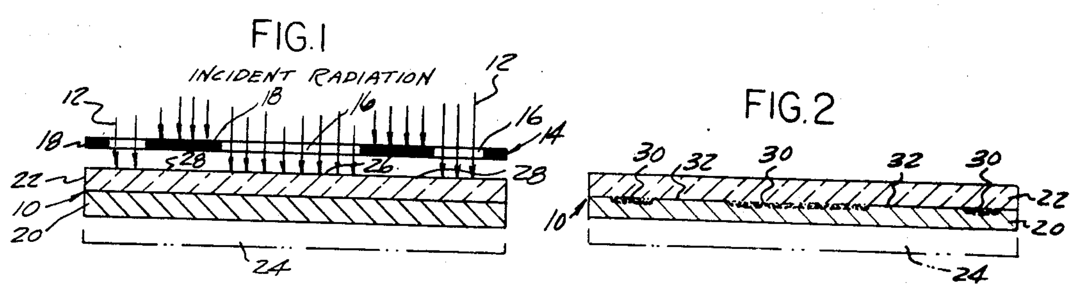
FIG. 1 is a schematic representation in section of a typical electromagnetic radiation-sensitive element during selective and discrete exposure to incident electromagnetic actinic radiation, such as light radiation.
FIG. 2 is a view similar to FIG. 1, but showing the radiation-sensitive element after exposure to incident electromagnetic actinic radiation.

As shown in FIG. 1, the first step in the methods of the present invention consists in exposing an electromagnetic radiation-sensitive element 10 to incident electromagnetic actinic radiation 12, such as light radiation. The radiation-sensitive element 10 is exposed, for example through a mask 14 presenting a predetermined pattern consisting of portions, as shown at 16, which are substantially transmissive of the incident actinic radiation and other portions, as shown at 18, which are substantially nontransmissive of the incident actinic radiation.

The radiation-sensitive element 10, as disclosed in detail in the copending parent application, Ser. No. 839,038, and in the other copending applications hereinbefore listed, consists essentially of a metallic layer 20, as defined therein and herein, provided on a face thereof with an overlayer 22 of a material capable of interreacting with the metallic layer 20 as a result of exposure to electromagnetic actinic radiation, such as light. The metallic layer 20 may be provided, if so required for some applications, with a metallic or nonmetallic support member or substrate, as shown in phantom line at 24.

As mentioned in copending application, Ser. No. 839,038, a list of chemical elements, mostly metals, particularly suitable for the metallic layer 20 includes among others, silver, copper, lead, cadmium, zinc, iron, tin, arsenic, bismuth, cobalt, germanium, indium, manganese, mercury, nickel, selenium, silicon, tellurium, thallium and vanadium, while metals such as gold, rhodium, palladium, platinum, aluminum, magnesium and the like have been found to be of little, if any usefulness for the purpose of the invention. The metallic layer 20 is in the form of a thin film or of a thin foil of a thickness that may vary, according to the purpose to be accomplished and according to the proposed use of the sensitive element, from a few atom layers to several thousand Angstroms or even a few mils.

By "metallic layer" is meant herein a layer containing silicon or any one of the common metals hereinbefore mentioned, either alone, or alloyed to another common metal, or in the form of a metallic mixture. Consequently, the term "-metallic layer" as used herein means a material containing at least silicon or one metal in the form hereinbefore indicated.

The overlayer 22 is also substantially thin, of the order of several atom layers to several microns, or even a few mils, and it may consist of any one of a variety of ternary and binary materials and compounds and any one of a few elements. As also mentioned in the hereinbefore referred to copending application, an example of ternary material, which has been found to be particularly suitable, is a glassy material consisting of arsenic, sulfur and iodine for example in the following proportions; arsenic—40 percent by weight, sulfur—50 percent by weight and iodine—10 percent by weight, although the proportion of iodine may be within the range of 1 to 30 percent by weight. Appropriate examples of such ternary materials are given in U.S. Pat. No. 3,024,119, issued Mar. 6, 1962. In such ternary materials, iodine, may be replaced by chlorine or bromine and sulfur may be replaced by selenium or tellurium.

A multitude of binary compounds and mixtures have been found to be useful for the inorganic material of the overlayer 22. Examples of such binary compounds or mixtures comprise halides of metals, such as copper, antimony, arsenic, sulfur, thallium, lead, cadmium and silver, sulfides, arsenides, selenides, and tellurides of such metals. The most suitable materials, presenting substantially sensitivity when deposited on a metallic layer of copper, silver, lead, zinc, etc., for example, are arsenic-sulfur mixtures and compounds, antimony-sulfur compounds and mixtures, silver-sulfur compounds and mixtures, bismuth-sulfur compounds and mixtures, chromium-sulfur compounds and mixtures, lead iodide, copper chloride, stannous chloride, mercury chloride, arsenic selenides, selenium-sulfur compounds and mixtures, chromium-selenium, and indium-sulfur compounds and mixtures. It seems that the property of reacting with a metallic layer, as defined herein, under the influence of electromagnetic actinic radiation is shared by a variety of mixtures and compounds, having such property to varying but generally useful degrees. Such binary compounds and mixtures may be generally cataloged as consisting of a metal halide, or a mixture of a metal with a halogen, metal selenide, or a mixture of metal with selenium, metal sulfide, or a mixture of a metal with sulfur, and metal telluride, or a mixture of a metal with tellurium. Stoichiometric proportions are not critical but it is preferable that the resulting material be substantially transparent to electromagnetic actinic radiations of an appropriate wavelength, especially when the overlayer is substantially thick. Glassy compounds and mixtures are generally preferred for that purpose when used in a substantial thickness.

Single elements, such as halogens, are also capable of reacting with a metallic layer when exposed to electromagnetic actinic radiation.

Consequently, a general grouping of inorganic materials suitable in the present invention as the material forming an actinically reactive overlayer when disposed on a metallic layer, as defined herein, consists of halogens, sulfur, selenium, M—X compounds and mixtures and M—X—Y compounds and mixtures, wherein X and Y are selected from the group consisting of a halogen, sulfur, selenium and tellurium, and M is a metal selected from the group consisting of arsenic, antimony, bismuth, selenium, tellurium, copper, zinc, cadmium, mercury, lead, chromium, gallium, indium, thallium, germanium, tin, iron, cobalt, nickel and silver.

Although several examples of suitable inorganic materials are given in the aforesaid copending application, all of which are suitable for the present invention, for illustrative purpose of the modes of operation of the present invention, particular mention is made in the examples hereinafter of a particularly suitable binary inorganic material presenting substantial sensitivity when deposited on an appropriate metallic layer, such as silver, copper, cadmium, lead, zinc or other metal, such material consisting of an arsenic-sulfur compound or mixture. For example, an overlayer 22 of arsenic-sulfur may be deposited upon a metallic layer 20 of silver, by conventional vacuum deposition techniques and other methods. The proportions of arsenic and sulfur may be varied broadly, such proportions preferably ranging from about 20 percent arsenic—80 percent sulfur by weight to 80 percent arsenic—20 percent sulfur by weight.

A typical example of electromagnetic radiation sensitive element 10, (FIG. 1), is made, for example, according to the following steps. An adequate substrate 24, if so desired, such as a plate of glass, ceramic, plastic, cardboard, or a metal such as, for example, aluminum or magnesium, is coated with a thin metallic layer 20 by being disposed in a bell jar evacuated at about 0.5 micron pressure. Silver metal for example is evaporated from tungsten electrical resistance heaters brought to about 1,100° C. by the passage of electrical current therethrough. By evaporating silver from the resistance heaters for about 3 seconds, a silver layer of about 4,000 A. is obtained on the substrate. Longer evaporation times provide proportionally thicker silver layers. For example, 15 to 20 seconds evaporation time provides silver layers on the substrate of approximately 1 micron. The thickness of the thin layer of silver deposited on the substrate is continuously monitored by a thin-film thickness monitor.

The substrate with this silver coating thereon or, alternately, for structures wherein the substrate is omitted a foil of silver or other appropriate metal is disposed in a bell jar evacuated to about 0.1 micron pressure. A mixture consisting for example of 60 percent arsenic and 40 percent sulfur, by weight, is placed in a quartz crucible in an electric resistance heater in the bell jar, the substrate with the silver coating thereon or, alternately, the metallic foil being located about 6 inches from the crucible. The arsenic-sulfur mixture is heated to about 350—° C. An evaporation time of about 28–30 seconds permits to obtain an overlayer 22 of arsenic-sulfur about 1 micron thick on the metallic layer or foil 20, with longer evaporation times providing proportionally thicker overlayers, and shorter evaporation times providing proportionally thinner overlayers.

Similar vacuum evaporation techniques may be used for depositing a metallic layer made of any appropriate metal, as hereinbefore indicated, on an appropriate substrate, and for depositing thereon or, alternately, on a metallic foil, an overlayer of an appropriate inorganic material, as also hereinbefore indicated.

An overlayer 22 of arsenic-sulfur, when deposited under the conditions hereinbefore described, forms a bond at the interface between the silver layer 20 and the arsenic-sulfur overlayer 22 having a substantially strong adhesion. It is obvious that by proper selection of the metal of the metallic layer 20, its surface condition, either perfectly polished or slightly roughened, and the type of inorganic material used for the overlayer, various degrees of mutual adhesion between the layers may thus be provided, as will be obvious to those skilled in the art. Strength of adhesion may be measured in arbitrary units such as pounds per square inch required to separate juxtaposed layers. The absolute strength of adhesion between the metallic layer and the overlayer is not important for the purpose of the present invention.

The radiation-sensitive element 10 made for example of a silver metallic layer 20 coated with an overlayer 22 of arsenic-sulfur is exposed to incident electromagnetic actinic radiation through a mask 14, as hereinbefore explained, or is exposed by means of an appropriate pattern being projected thereon by appropriate projection means. During exposure of the radiation-sensitive element, which is shown to be effected on the face thereof provided with the overlayer 22, some areas, as shown at 26, are impinged upon the incident electromagnetic actinic radiation 12 while other areas, as shown at 28, are not subjected to the effect of irradiation. As a result of such selective and discrete exposure to electromagnetic actinic radiation, at discrete areas of the boundary layer between the silver metallic layer 20 and the arsenic-sulfur overlayer 22 which are exposed to electromagnetic radiation, there is formed, selectively and discretely, an interreaction product or products, as shown at 30 in FIG. 2. The areas not subject to irradiation are left undisturbed, as shown —at 32. The formation of such interreaction product 30, at the irradiated areas, causes a substantial selective and discrete reduction of the force of adhesion between the arsenic-sulfur overlayer 22 and the silver metallic layer 20.

With structures consisting of a silver metallic layer with an arsenic-sulfur overlayer, exposure times of several seconds with an illumination from a 35- to 100-watt incandescent lamp light source is sufficient. The strength of adhesion at the interface between the metallic layer 20 and the overlayer 22 at the areas corresponding to such irradiated areas 26 at which there is formed the interreaction product or products 30 is substantially reduced to a value which is much less than the normal strength of adhesion between the metallic layer 20 and the overlayer 22, and such normal interlayer force of adhesion remains unaffected at the unexposed areas 28.

Figure 3:
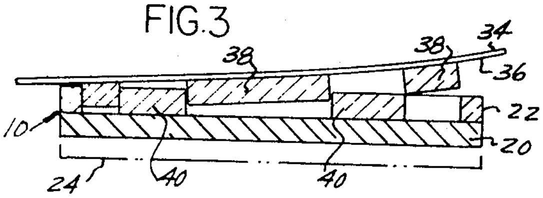
FIG. 3 is a schematic view in section showing a step in the method of the invention which consists in removing discrete portions of the radiation-sensitive element overlayer corresponding to the areas of the element which have precedently been exposed to incident electromagnetic actinic radiation.

The portions of the overlayer 22 corresponding to the irradiated areas 26 may be removed by means such as, for example, a nonrigid sheet element as shown at 34 in FIG. 3, provided on one face 36 thereof with an adhesive forming a bond with the overlayer 22 intermediate in strength between the force of adhesion of the overlayer 22 with the metallic layer 20 and the reduced force of adhesion therebetween at the irradiated areas 26. Therefore, when the adhesive coated sheet 34 is pulled back, the portions of the overlayer 22 corresponding to the irradiated areas 26 of the radiation-sensitive element 10 are pulled and carried away by the sheet 34, as shown at 38, as the result of adhering to the sheet with more strength that the interlayer adhesion of the irradiated areas 26, while the other portions, such as shown at 40, of the overlayer 22 which remain strongly adhering to the metallic layer 20 are caused to cleanly break away and separate from he portions 38 and to remain in position, such —that the stripped radiation-sensitive element is substantially as shown schematically at FIG. 4 with discrete surface areas 42 of the metallic layer being bared and no longer protected by the overlayer 22. With the previously described examples of alternate structures consisting of a silver foil 20, or of a silver layer 20 vacuum deposited on a substrate 24, provided with a vapor deposited overlayer 22 of arsenic-sulfur, an appropriate convenient peeling member 34 consists of commercially available pressure-sensitive adhesive tape.

Figure 5:
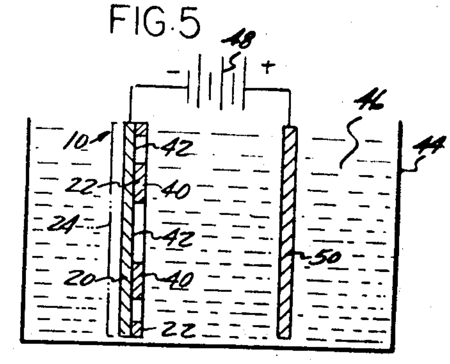
FIG. 5 is a schematic representation in section of an arrangement for electroplating the areas of the metallic layer uncovered as a result of removing portions of the overlayer.

After peeling of the portions 38 of the overlayer 22, the uncovered surface areas 42 of the metallic layer 20 are subsequently plated, according to one aspect of the present invention, by being placed in a tank 44, FIG. 5, containing an appropriate electrolyte 46 in which the element 10 is submerged, the metallic layer 20 being placed in a direct current electrical circuit including a source of direct current 48 such as to form a cathode by being connected to the negative terminal thereof, a plate or block of appropriate metal, as shown at 50, being connected to the positive terminal of the power supply 48 so as to form an anode. According to the electrolyte used and the composition of anodic plate 50, metal or metals of predetermined composition are electrolytically deposited on the metallic layer 20 at the areas 42 which are not protected by the remaining portions 40 of the overlayer 22. It is obvious that if the metallic layer 20 is not provided with an insulating support member or substrate 24 it is preferable to coat the surface of the metallic layer 20 opposite to the surface thereof discretely provided with remaining portions 40 of the overlayer 22 with an insulating paint or varnish so as to prevent plating of such face if such plating is undesirable. The majority of the inorganic materials suitable for the overlayer 22 and listed hereinbefore behaving for all practical purpose as a dielectric relatively the metallic layer 20, there is no substantial plating of the surface of the remaining portions 40 of the overlayer 22 in contact with the electrolyte. If slightly current-conducting materials are used to form the overlayer 22, whatever plating of the overlayer occurs is of little importance because of the poor adherence of such plating to the base material and the thinness of the electroplated coating therein which may subsequently be easily removed by simple mechanical or chemical cleaning. Alternately, when the overlayer 22 is made of a material that may be subjected to some plating, a simple coating operation of the outer surface of the remaining portions 40 of the overlayer with a nonconductive material or with an oily material removes any tendency for such outer surface to plate during the plating operation. Information as to suitable plating baths and techniques is commonly available and may be found in many textbooks such as, for example Modern Electroplating By A. G. Gray, published by John Wiley and Sons, Inc., New York, 1953, Electroplating Engineering Handbook by A. K. Graham, published by Reinhold Publishing Corporation, New York, 1955 and Printed and Integrated Circuitry by T. D. Schlabach and D. K. Rider, published by McGraw-Hill Book Company, Inc., New York, 1963.

Figure 6:
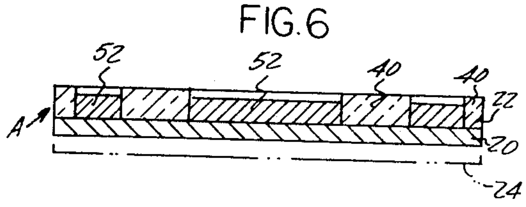
FIGS. 6 and 6*a* are schematic views in section of the radiation-sensitive element after electroplating with a relatively thin coating and a relatively thick coating, respectively.
Figure 6A:
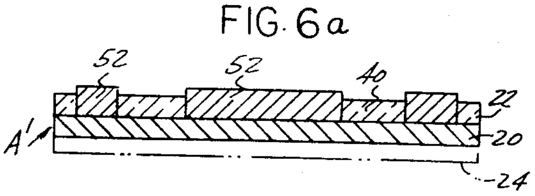

After plating, the resulting article is as shown schematically in section at A in FIG. 6 or at A' in FIG. 6*a*, with electroplated portions 52 forming a relief metallic pattern corresponding to the pattern of exposure to electromagnetic actinic radiation of the radiation-sensitive element. The plating operation is effected for an appropriate period of time which is sufficient to apply a metallic coating 52 of a required thickness deposited upon the exposed or uncovered areas 42 of the metallic layer 20. The thickness of the plating is shown in FIG. 6 as being less than the thickness of the remaining portions 40 of the overlayer 22. It is obvious that when a thicker plated coating is sought, the plating operation according to the arrangement of FIG. 5 may be continued until the plated coating is of a greater thickness, as shown at 52 in FIG. 6*a* where such plating is shown to be thicker than the remaining portions —40 of the overlayer 22.

For some applications the resulting useful article may be as represented at A and A', in FIGS. 6 and 6*a* respectively, but for other applications it may be found desirable to remove the remaining portions 40 of the overlayer 22.

Figure 8:
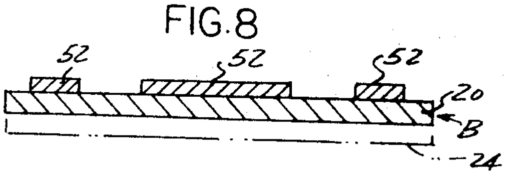
FIG. 8 is a view similar to FIG. 7, but showing the element after removal of the remaining portions of the overlayer subsequent to the second exposure to electromagnetic actinic radiation of FIG. 7.
Figure 9:
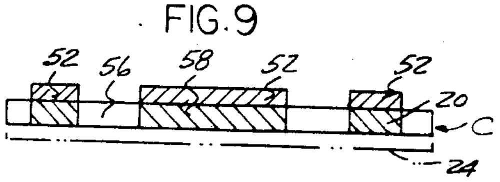
FIG. 9 is a view similar to FIG. 8, but showing the results accomplished by a second exposure to electromagnetic actinic radiation of a duration and intensity sufficient to consume in depth the whole thickness of the metallic layer at the areas remaining coated with portions of the overlayer previously to such second exposure.
Figure 7:
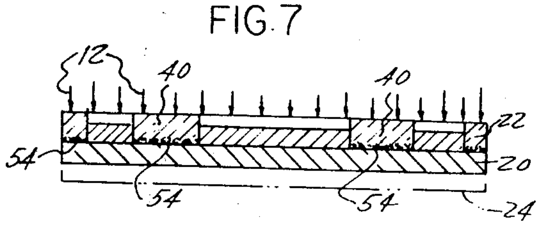
FIG. 7 is a view similar to the view of FIG. 6, but showing the element of FIG. 6 in the course of a second exposure to electromagnetic actinic radiation.

The remaining portions 40 of the overlayer 22 may be subsequently removed by any appropriate means such as chemical dissolution in an appropriate solvent or heat sublimation, as explained in the copending applications, or, as shown in FIG. 7 by a second exposure to electromagnetic actinic radiation 12 which causes an interreaction between the inorganic material of the overlayer 22, at the remaining portions 40 thereof and the metallic layer 20 at the areas where such metallic layer and inorganic material are juxtaposed, with formation of interreaction product as shown at 54. Such second exposure to electromagnetic actinic radiation considerably weakens the bond between the remaining portions 40 of the overlayer 22 and the metallic layer 20, such that the remaining portions 40 of the overlayer can be easily removed by mechanical means such as by stripping or peeling by way, for example, of the means previously described and illustrated at FIG. 3. The resulting article is thus substantially as article B of FIG. 8, consisting essentially of the metallic layer 20 having thereon a plated metallic pattern 52. If the second exposure to electromagnetic actinic radiation is effected for a period of time and with an intensity of radiation sufficient to consume in depth the portions of metallic layer 20 still provided with an overlayer, after removal of the interreaction product formed during the second exposure to electromagnetic radiation, the resulting finished article is substantially as shown at C in FIG. 9. Article C is provided with voids 56 formed in the metallic layer 20 as a result of the second exposure to electromagnetic actinic radiation such that the finished article presents a high-relief metallic pattern comprising the portions of plated metal 52 superimposed upon the remaining portions 58 of the metallic layer 20.

Figure 4:
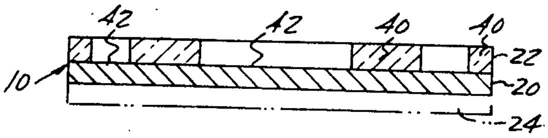
FIG. 4 is a view similar to FIG. 3, but showing the radiation-sensitive element after removal of portions of the overlayer.
Figure 10:
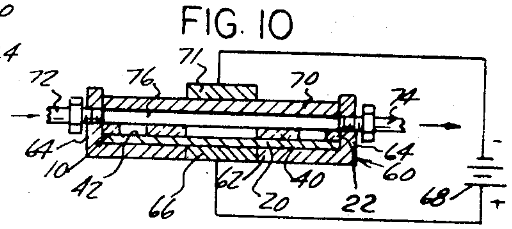
FIG. 10 is a schematic representation of an arrangement for electrochemically removing or eroding area portions of the metallic layer uncovered as a result of selectively and discretely removing portions of the overlayer.

According to a second aspect of the present invention, the exposed and stripped radiation-sensitive element 10 of FIG. 4 may be subsequently treated by electrochemical erosion or etch in an arrangement as schematically represented at FIG. 10. The element 10, consisting principally of the metallic layer 20 provided selectively and discretely with remaining portions 40 of the overlayer 22 is placed in an enclosure 60 having a bottom wall 62 and sidewalls 64. The enclosure 60 is made of a nonconductive material and has means such as contact 66 electrically connecting to the positive terminal of a direct current power supply 68 the metallic layer 20 of the element 10 for rendering the metallic layer 20 anodic with respect to a current-conductive plate 70 rendered cathodic by being connected by means of a contact 71 to the negative terminal of the direct current power supply 68. The enclosure 60 is provided with an inlet 72 and an outlet 74 for an electrolytic solution 76 caused to be circulated at high velocity and high pressure in the interface between element 10 and the cathode plate 70 by means of an appropriate electrolyte pumping and circulation system, not shown. By way of the arrangement of FIG. 10, and according to the now well-known principles of electrochemical machining, when a direct current under a potential of, for example, 10 to 20 volts, and of a substantially high current density is caused to circulate through the electrolyte, the exposed or uncovered surface areas 42 of the element 10 are electrochemically eroded or etched, while the surface areas protected by the remaining portions 40 of the overlayer 22, which acts as a dielectric, remain undisturbed. A convenient electrolyte consists of an aqueous solution of sodium chloride being supplied to the interface between the plate 70 and the element 10 at a pressure of, for example, 10 to 50 p.s.i.

Figures 11, 12, 13, 14, 15, 16, 17, 18, 19, 20, 21:
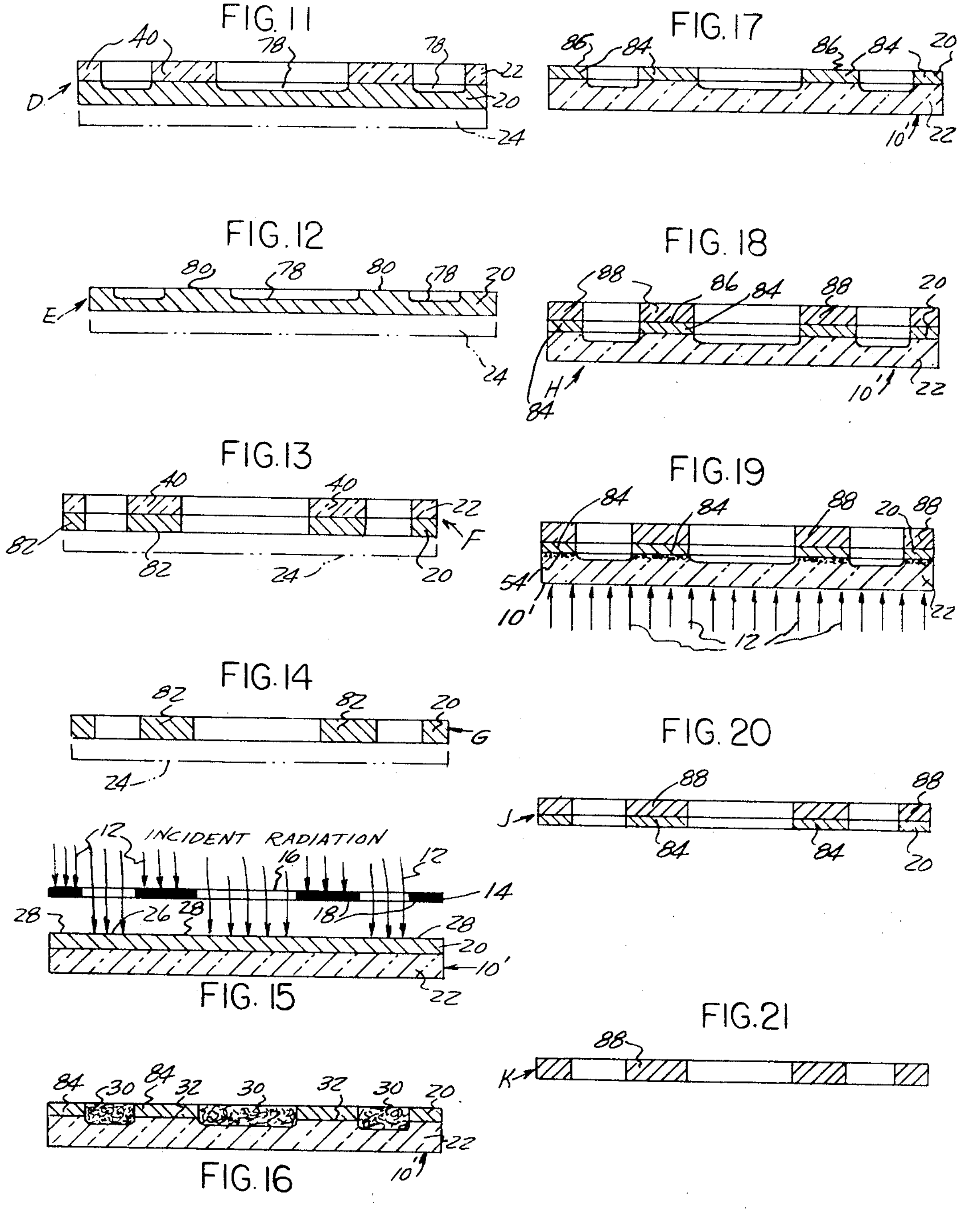
FIG. 11 is a first form of article obtained as a result of electrochemically eroding the area portions of the metallic layer uncovered by the overlayer.
FIG. 12 is the article of FIG. 11, with the remaining portions of the overlayer removed.
FIG. 13 is a view similar to FIG. 11, but showing the results accomplished by complete erosion, by way of the arrangement of FIG. 10, of the uncovered area portions of the metallic layer.
FIG. 14 is a view similar to FIG. 13 but showing the article after removal of the remaining portions of the overlayer.
FIG. 15 is a schematic view similar to FIG. 1, but showing a radiation-sensitive element during selective and discrete exposure to electromagnetic actinic radiation impinging on the metallic layer side of the element.
FIG. 16 is a view similar to FIG. 15 but showing the radiation-sensitive element after exposure to incident electromagnetic actinic radiation.
FIG. 17 is a view similar to FIG. 16, but showing the radiation-sensitive element after removal of the products resulting from the radiation provoked interreaction between the constituents of the radiation-sensitive element.
FIG. 18 is a view similar to FIG. 17 but showing the radiation-sensitive element after electroplating of the remaining portions of the metallic layer.
FIG. 19 is a view similar to FIG. 18, but showing the element of FIG. 18 in the course of a second exposure to electromagnetic actinic radiation for the purpose of obtaining an alternate structure of finished article.
FIG. 20 is a schematic view in section of the resulting article obtained after the second exposure of FIG. 19.
FIG. 21 is a schematic view in section of a modification of the resulting article obtained after the second exposure of FIG. 19.

If the electrochemical operation according to the arrangement of FIG. 10 is allowed to take place for a relatively short period of time only, the resulting article is as article D shown at FIG. 11 and consisting of the remaining portions 40 of the overlayer 22 remaining adhering to the metallic layer 20, and of the metallic layer 20 having its exposed surface areas eroded or etched to a depth, as shown at 78, depending from the duration of the electrochemical eroding operation at a predetermined current density.

After removal of the remaining portions 40 of the overlayer 22, for example by way of a second exposure to electromagnetic radiation which, as previously explained, reduces the force of adhesion between the metallic layer and the overlayer facilitating subsequent removal of the remaining portions of the overlayer, the finished article is as represented at E at FIG. 12, consisting principally of the metallic layer 20 having on the surface thereof a relief pattern, as shown at 80, consisting of the surface areas of the metallic layer, which were protected by the remaining portions of the overlayer 22 during the electrochemical-eroding operation, projecting from the eroded unprotected areas 78.

If the electrochemical operation according to the arrangement of FIG. 10 is allowed to continue until the electroerosion of the portions of the metallic layer 20 unprotected by the remaining portions 40 of the overlayer 22 has propagated in depth to the whole thickness of the metallic layer, the resulting article is as shown at F in FIG. 13. Article F consists essentially of the remaining portions 82 of the metallic layer 20 covered with the remaining portions 40 of the overlayer 22. After removal of the remaining portions 40 of the overlayer 22, for example by exposure to electromagnetic actinic radiation followed by stripping according to the method hereinbefore explained, the finished article is as shown at G in FIG. 14, consisting essentially of a perforated pattern formed by the remaining portions 82 of the metallic layer 20.

The radiation-sensitive element 10' is shown at FIG. 15 while being exposed to incident electromagnetic actinic radiation 12 on its metallic layer side. Exposure is through a mask 14 provided with discrete portions 16 substantially transmissive of such actinic radiation, such that the surface of the metallic layer 20 is selectively and discretely impinged upon by the incident actinic radiation at portions 26, while other portions 28 are left undisturbed. At the boundary or interface between the metallic layer 20 and the substrate 22, at the regions thus impinged, for sufficient exposure to the incident actinic radiation in time or intensity, or both, there is formed an interreaction product or products, as shown at 30 in FIG. 16 which, in view of the thinness of the metallic layer 20, consumes in depth all of the metal of the metallic layer. Exposure times of 5 to 15 minutes with an incandescent lamp of 30 watts is all that is necessary for an element 10' having, for example, a metallic layer 20 of silver, a few Angstroms thick so as to be transmissive of the actinic radiation on a substrate 20 of arsenic-sulfur. The other portions 32 of the boundary which are shielded from the electromagnetic actinic radiation remain provided with unreacted portions 84 of the metallic layer 20. Once the interreaction produce 30 is removed, for example and as mentioned in the parent application, Ser. No. 839,038, by mechanical means such as wiping, or chemical means such as dissolving the interreaction product in an aqueous solution of a base such as sodium sulfide or sodium hydroxide for example, the radiation-sensitive element is as shown at FIG. 17, comprising the substrate 22 provided with discrete portions 84 of the metallic layer 20 forming an appropriate pattern corresponding to the pattern provided by the mask through —which the radiation-sensitive element was first exposed to electromagnetic actinic radiation or, alternately, to the pattern projected upon the surface of the metallic layer 20. The discrete surface areas 86 of the remaining portion 84 of the metallic layer 20 may subsequently be electroplated with an appropriate metal by means of an arrangement as previously described with respect to FIG. 5 herein, the metallic layer 20 being adequately connected to the negative terminal of the power supply. After electroplating, the resulting article is as shown at H in FIG. 18. Article H thus comprises the remaining portions 84 of the metallic layer 20 adhering to the substrate 22 and having their surface areas 86 plated, as shown at 88, with a coating of additional metal. Such an article could be, for example, an electrical circuit.

If, however, it is desired to obtain a finished article from which the substrate 22 is removed, the substrate 22 may be dissolved in an appropriate solvent, or alternately, the substrate 22 may be removed by way of a second exposure of the element, as illustrated at FIG. 19, by impinging electromagnetic actinic radiation 12 on the substrate side so as to cause the formation of interreaction product 54 at the interface between the remaining portions 84 of the metallic layer 20 and the adjoining substrate 22. Such a second exposure, as previously mentioned, needs be in duration and intensity only what is required to reduce the force of adhesion between the remaining portions 84 of the metallic layer 20 and the contact area of the substrate 22, such —that the substrate 22 may subsequently be easily peeled off the metallic layer 20, providing the finished article J illustrated in FIG. 20.

If the second exposure to electromagnetic actinic radiation is, in intensity and duration, sufficient to consume all of the remaining portions 84 of the metallic layer 20, the resulting article is as article K of FIG. 21 which consists exclusively of a metallic pattern formed by the electroplated portions 88 of the electroplated metal. In such alternate aspect of the present invention, the electromagnetic radiation-sensitive element has been used only as a vehicle for obtaining an appropriate metallic pattern corresponding to the pattern originally projected upon the element, made of metals or alloys of any appropriate composition and thickness. Such a method has a particular usefulness when it is desired to obtain a metallic pattern made of a metal which shows poor reaction with or which is incapable of reacting with the inorganic material forming the layer 22 under the influence of electromagnetic actinic radiation, as for example is the case for gold and aluminum.

It can thus be seen that the methods of the present invention provide for making relief metallic patterns by means of a radiation-sensitive element which is subsequently treated by electrochemical means such as to selectively and discretely plate selected portions of the element or, alternately such as to selectively and discretely erode selected portions of the element.

It will be obvious to those skilled in the art that the examples of typical structures and compositions of electromagnetic radiation-sensitive elements herein disclosed and the methods of making such elements were given for illustrative purpose only for the sake of better understanding of the methods of the present invention.

Having thus described the invention by typical illustrative examples thereof, what is sought to be protected by United States Letters Patent is as follows:

1. A method for making a relief image by means of an actinic radiation-sensitive element comprising two dissimilar layers substantially adhering to each other, the first of said layers selected from the group consisting of silver, copper, lead, cadmium, zinc, iron, tin, arsenic, bismuth, cobalt, germanium, indium, manganese, mercury, nickel, selenium, silicon, tellurium, thallium and vanadium, and the second of said layers being of an inorganic material different from that of the first of said layers and capable when exposed to said radiation to form an interreaction product with said first layer, said inorganic material being selected from the group consisting of sulfur, selenium, M—X compounds and mixtures and M—X—Y compounds and mixtures, wherein M is a metal selected from the group consisting of arsenic, antimony, bismuth, selenium, tellurium, copper, zinc, cadmium, mercury, lead, chromium, gallium, indium, thallium, germanium, tin, iron, cobalt, nickel and silver, and X and Y are selected from the group consisting of halogen, sulfur, selenium and tellurium, wherein at least one of said layers is substantially transmissive of said actinic radiation, said method comprising the steps of:
impinging an actinic radiation defined image upon the transmissive layer of said radiation-sensitive element with an intensity and for a period of time sufficient for causing selectively and discretely the formation of said interreaction product at predetermined areas of the boundary between said first and second layers for selectively and discretely reducing the adhesion therebetween;
removing portions of said second layer corresponding to the boundary areas of reduced adhesion so as to bare said first layer at said areas; and
electroplating metal on said areas of said first layer where thus bared.

2. The method of claim 1 further comprising the steps of:
subsequently exposing said radiation-sensitive element uniformly to electromagnetic actinic radiation impinging upon said transmissive layer for causing the formation of said interreaction product at the remaining areas of the boundary between said first and second layers for reducing the adhesion therebetween; and
removing the remaining portions of said second layer.

3. The method of claim 1 further comprising the steps of:
subsequently exposing said radiation-sensitive element uniformly to electromagnetic actinic radiation impinging upon said second layer for causing the formation of said interreaction product at the remaining portions of said first and second layers for consuming in depth the remaining of said first layer at said portions; and
removing said interreaction product.

4. A method for making a relief image by means of an actinic radiation-sensitive element comprising two dissimilar layers substantially adhering to each other, the first of said layers being selected from the group consisting of silver, copper, lead, cadmium, zinc, iron, tin, arsenic, bismuth, cobalt, germanium, indium, manganese, mercury, nickel, selenium, silicon, tellurium, thallium and vanadium, and the second of said layers being of an inorganic material different from that of the first of said layers and capable when exposed to said radiation to form an interreaction product with said first layer, said inorganic material being selected from the group consisting of sulfur, selenium, M—X compounds and mixtures and M—X—Y compounds and mixtures, wherein M is a metal selected from the group consisting of arsenic, antimony, bismuth, selenium, tellurium, copper, zinc, cadmium, mercury, lead, chromium, gallium, indium, thallium, germanium, tin, iron, cobalt, nickel and silver, and X and Y are selected from the group consisting of halogen, sulfur, selenium and tellurium, wherein at least one of said layers is substantially transmissive of said actinic radiation, said method comprising the steps of:
impinging an actinic radiation defined image upon the transmissive layer of said radiation-sensitive element with an intensity and for a period of time sufficient for causing selectively and discretely the formation of said interreaction product at predetermined areas of the boundary between said first and second layers for selectively and discretely reducing the adhesion therebetween;
removing portions of said second layer corresponding to the boundary areas of reduced adhesion so as to bare said first layer at said areas; and
electrochemically etching the material of said first layer at said layer first layer where thus bared.

5. The method of claim 4 wherein said first layer is electrochemically etched entirely in depth where thus bared.

6. The method of claim 4 further comprising the steps of:
subsequently exposing said radiation-sensitive element uniformly to electromagnetic actinic radiation impinging upon said transmissive layer for causing the formation of said interreaction product at the remaining areas of the boundary between said first and second layers for reducing the adhesion therebetween; and
removing the remaining portions of said second layer.

7. The method of claim 5 further comprising the steps of:
subsequently exposing said radiation-sensitive element uniformly to electromagnetic actinic radiation impinging upon said transmissive layer for causing the formation of said interreaction product at the remaining areas of the boundary between said first and second layers reducing the adhesion therebetween; and
removing the remaining portions of said second layer.

8. A method for making a relief image by means of an actinic radiation-sensitive element comprising two dissimilar layers substantially adhering to each other, at least the first of said layers being substantially transmissive of the actinic radiation and being selected from the group consisting of silver, copper, lead, cadmium, zinc, iron, tin, arsenic, bismuth, cobalt, germanium, indium, manganese, mercury, nickel, selenium, silicon, tellurium, thallium and vanadium, and the second of said layers being of an inorganic material different from that of the first of said layers and capable when exposed to said actinic radiation to form an interreaction product with said first layer, said inorganic material being selected from the group consisting of sulfur, selenium, M—X compounds and mixtures and M—X—Y compounds and mixtures wherein M is a metal selected from the group consisting of arsenic, antimony, bismuth, selenium, tellurium, copper, zinc, cadmium, mercury, lead, chromium, gallium, indium, thallium, germanium, tin, iron, cobalt, nickel and silver, and X and Y are selected from the group consisting of halogen, sulfur, selenium and tellurium, said method comprising the steps of:

impinging an actinic radiation defined image upon the first layer of said radiation-sensitive element with an intensity and for a period of time sufficient for causing selectively and discretely the formation of said interreaction product at predetermined areas of the boundary between said first and second layers for selectively and discretely consuming in depth portions of said first layer;

removing said interreaction product; and electroplating metal on the remaining areas of said first layer.

9. The method of claim 8 wherein said second layer is transmissive of said actinic radiation and further comprising the steps of:

subsequently exposing said radiation-sensitive element uniformly to electromagnetic actinic radiation impinging upon said second layer for causing the formation of said interreaction product at the remaining areas of the boundary between said first and second layers for reducing the adhesion therebetween; and removing said second layer.

10. The method of claim 8 further comprising the steps of:

subsequently exposing said radiation-sensitive element uniformly to electromagnetic actinic radiation for causing the formation of said interreaction product at the remaining portions of said first and second layers for consuming in depth the remaining of said first layer at said portions; and removing said interreaction product and said second layer.

* * * * *